(12) United States Patent
Stanisic

(10) Patent No.: US 6,850,072 B1
(45) Date of Patent: Feb. 1, 2005

(54) METHODS AND APPARATUS FOR ANALYZING HIGH VOLTAGE CIRCUIT BREAKERS

(75) Inventor: Zoran Stanisic, Taby (SE)

(73) Assignee: General Electric Company, Schenectady, NY (US)

( * ) Notice: Subject to any disclaimer, the term of this patent is extended or adjusted under 35 U.S.C. 154(b) by 27 days.

(21) Appl. No.: 10/403,695

(22) Filed: Mar. 31, 2003

(51) Int. Cl.$^7$ .............................................. G01R 31/02
(52) U.S. Cl. ...................................... 324/424; 324/523
(58) Field of Search ................................ 324/420, 421, 324/422, 423, 424, 523; 351/42, 50

(56) References Cited

U.S. PATENT DOCUMENTS

| | | | |
|---|---|---|---|
| 4,326,167 A | * | 4/1982 | Fehr et al. ................... 324/415 |
| 5,119,260 A | * | 6/1992 | Huhse et al. ................... 361/2 |
| 5,729,145 A | | 3/1998 | Blades |
| 5,736,861 A | | 4/1998 | Keleher et al. |
| 6,466,029 B2 | | 10/2002 | Stroth et al. |
| 6,618,649 B1 | * | 9/2003 | Shilo .......................... 700/292 |
| 2003/0132753 A1 | * | 7/2003 | Lavoie et al. ................ 324/424 |

FOREIGN PATENT DOCUMENTS

JP      7280897      10/1995

* cited by examiner

*Primary Examiner*—Anjan Deb
*Assistant Examiner*—Walter Benson
(74) *Attorney, Agent, or Firm*—Armstrong Teasdale LLP

(57) ABSTRACT

Methods, computer program segment and apparatus for analyzing high voltage circuit breakers are provided. The method includes electrically coupling each circuit breaker contact to ground, applying a test voltage across a circuit breaker contact, measuring an output voltage signal that is proportional to a capacitance of the circuit breaker contact, changing a state of the circuit breaker contact pair from at least one of an open position to a closed position and the closed position to the open position, and detecting a step change of the output voltage that corresponds to the change of state of the circuit breaker. A circuit breaker test device is provided. The device includes a test voltage source, a filter circuit, and an output circuit for measuring the circuit breaker contact pair capacitance, wherein the test voltage source and filter circuit are configured to be coupled to the circuit breaker contact pair during testing.

25 Claims, 4 Drawing Sheets

METHODS AND APPARATUS FOR ANALYZING HIGH VOLTAGE CIRCUIT BREAKERS

BACKGROUND OF THE INVENTION

This invention relates generally to high voltage circuit breakers, and more specifically to methods and systems for analyzing circuit breaker contacts.

During testing of at least some known circuit breakers, a plurality of circuit breaker parameters may be monitored to facilitate determining that the circuit breaker is operating as designed. One such parameter may be a circuit breaker contact pair status, which may indicate whether the contacts are opened or closed, and an analog position of the circuit breaker contacts.

Timing the main contact and auxiliary contacts may also be indicative of each contacts' state. At least some known contacts are timed using a small DC current induced into a first of the pair of contacts and detecting the current at a second of the contact pair. In one embodiment, the DC current may be recorded such that a current trace may be used to determine the timing of each contact. In an alternative embodiment, the presence or absence of the DC current may be used to start and stop timers to facilitate directly measuring the contact timing. Circuit breaker contact analog position and contact motion may be determined applying a mechanical transducer to the circuit breaker contact mechanism to transfer a motive force to a movable contact of the contact pair.

Circuit breaker contact timing may be affected by induced currents, voltages, or other disturbances in a high voltage environment where circuit breaker typically is performed. Such disturbances may put a demand on the test equipment that limit the effectiveness and/or portability of the test equipment. Motion measurement may be complicated by mechanical difficulties when mounting the transducer to the circuit breaker and when measuring rapid mechanical acceleration during circuit breaker operation. Additionally, a material the circuit breaker contact is constructed from may adversely affect the timing result. At least some known circuit breaker designs use contact materials with a relatively higher contact resistance, such as, for example, graphite, to protect the contact surface from wear during contact arcing. Furthermore, present timing techniques require removal of grounding cables from the circuit breaker under test to receive accurate results.

BRIEF DESCRIPTION OF THE INVENTION

In one aspect, a method for analyzing circuit breakers is provided. The method includes electrically coupling each circuit breaker contact to ground, applying a test voltage across a circuit breaker contact, measuring an output voltage signal that is proportional to a capacitance of the circuit breaker contact, changing a state of the circuit breaker contact from at least one of an open position to a closed position and the closed position to the open position, and detecting a step change of the output voltage that corresponds to the change of state of the circuit breaker.

In another aspect, a computer program embodied on a computer readable media for analyzing circuit breakers is provided. The program includes a software code segment programmed to control a test source to apply a test voltage across a circuit breaker contact, measure an output voltage signal derived from the applied test voltage that is proportional to a capacitance of the circuit breaker contact, control operation of the circuit breaker under test to change a state of the circuit breaker contact from at least one of an open position to a closed position and the closed position to the open position, and detect a step change of the output voltage that corresponds to the change of state of the circuit breaker.

In yet another aspect, a test device for analyzing circuit breakers is provided. The device includes at least a test voltage source, a filter circuit, and an output circuit for measuring the circuit breaker contact capacitance, wherein the test voltage source and filter circuit are configured to be coupled in electrical series with the circuit breaker contact during testing.

DETAILED DESCRIPTION OF THE INVENTION

Periodic testing of circuit breakers may include a contact timing test. The timing test continuously measures the circuit breaker contact capacitance, from which the moment of first contact touch, and when the maximum capacitance between the contacts is reached may be determined. Further, the maximum capacitance value, in the function of time, may be used as a start or a stop value in the total operating time measurement.

Additionally, although the herein described methods are described with regard to circuit breaker contacts, it is contemplated that the benefits of the invention accrue to non-circuit breaker contacts such as those contacts typically employed in, for example, but not limited to, relays or switches.

Figure 1:
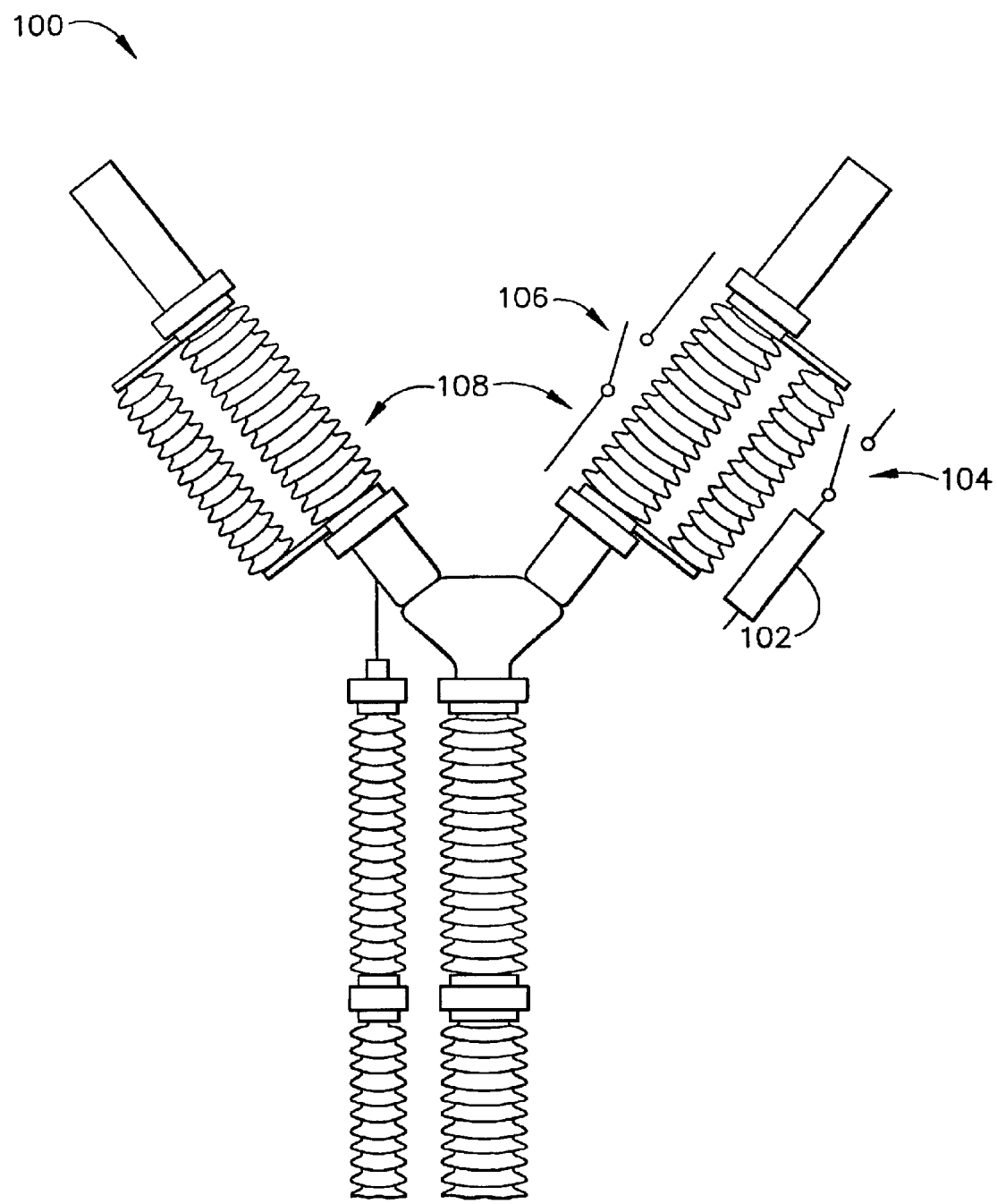
FIG. 1 is a schematic illustration of an exemplary high voltage circuit breaker phase.

FIG. 1 is a schematic illustration of an exemplary high voltage circuit breaker phase 100. A high voltage circuit breaker (not shown) may include a pre-insertion resistor 102 and a moving resistor contact 104 electrically in parallel with a moving main contact 106. In the exemplary embodiment, phase 100 includes two breaks 108 each break 108 includes a pre-insertion resistor (only one shown in FIG. 1).

In operation, from an open position, the circuit breaker receives a command to close, linkages within the circuit breaker cause movable portions of contacts 104 and 106 to move toward engagement of the respective non-movable portions of contacts 104 and 106. During a testing sequence, movement of the movable portion of contacts 104 and 106 may begin a timer. In the exemplary embodiment, the movement of the movable portion of contacts 104 and 106 is detected using electrical parameters associated with contacts 104 and 106. After a predetermined distance of travel of the movable portions of contacts 104 and 106, the movable portion of pre-insertion resistor contact 104 engages a respective non-movable portion. After a predetermined time delay, the movable portion of contact 106 engages a respective non-movable portion of main contact 106. During testing, the timing of circuit breaker contacts 104 and 106 may be determined. In an embodiment wherein there is no pre-insertion resistor 102 only the timing of main contact 106 and auxiliary contacts (not shown) are determined.

Figure 2:
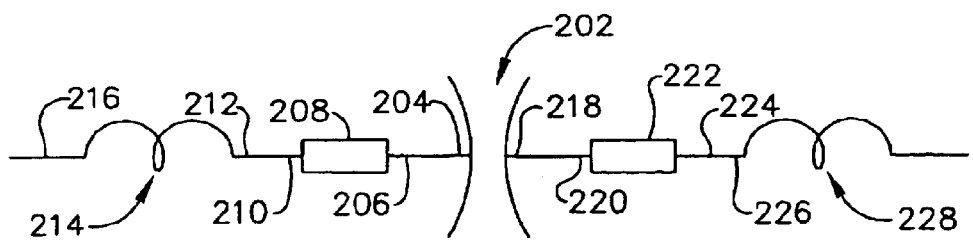
FIG. 2 is a schematic illustration of an exemplary equivalent circuit of a contact pair that may be used in the circuit breaker phase shown in FIG. 1.

FIG. 2 is a schematic illustration of an exemplary equivalent circuit 200 of a contact pair that may be used in circuit breaker phase 100 (shown in FIG. 1). Equivalent circuit 200 includes a capacitor 202 that represents contact surfaces of circuit breaker contacts 104 and 106. During testing, capacitance parameters associated with the circuit breaker contacts, such as, a surface area of each contact surface and a dielectric media surrounding the contact pair each have a constant value. A distance between the contact surfaces of the contact pair is variable based on the contact state, opened or closed, and a amount of travel between fully opened and fully closed. The distance between the contact surfaces is the only capacitance parameter associated with the circuit breaker contacts that substantially varies during operation of the circuit breaker.

A first lead 204 of capacitor 202 is electrically coupled to a first lead 206 of a resistor ($R_a$) 208 and a second lead 210 of resistor ($R_a$) 208 is electrically coupled to a first lead 212 of an inductor ($L_a$) 214. A second lead 216 of inductor ($L_a$) 214 is coupled to a forcing function (not shown) that represents a test signal used to measure the circuit breaker contact timing. Resistor ($R_a$) 208 and inductor ($L_a$) 214 represent the inductance and resistance of the circuit breaker input components. A second lead 218 of capacitor 202 is electrically coupled to a first lead 220 of a resistor ($R_b$) 222 and a second lead 224 of resistor ($R_b$) 222 is electrically coupled to a first lead 226 of an inductor ($L_b$) 228. A second lead of inductor ($L_b$) 228 is coupled to the forcing function return. Resistor ($R_b$) 222 and inductor ($L_b$) 228 represent the inductance and resistance of the circuit breaker output components. Resistors ($R_a$) 208 and ($R_b$) 222, and inductors ($L_a$) 214 and ($L_b$) 228 are represented as constant resistance and inductance values, respectively. Circuit parameters affecting these model components, such as, cable length, diameter and material are substantially constant during testing. The absolute values of resistors ($R_a$) 208 and ($R_b$) 222, and inductors ($L_a$) 214 and ($L_b$) 228 and the steady state value of the contact capacitance are determined by the physical characteristics of each circuit breaker and may vary depending on location and environmental conditions.

During testing, equivalent circuit 200 models the high voltage circuit breaker as a dynamic system with one static and one moveable contact, represented by capacitor 202 that changes capacitance value by the motion of the moveable electrode. By measuring the capacitance dynamically, a minimum distance between circuit breaker contacts before the first contact touch, which corresponds to maximum capacitance in the system may be determined. Additionally, the occurrence of the maximum capacitance value may be used to start and/or stop one or more timers measuring a total operating time (timing) and a recorded capacitance waveform enables analyzing other circuit breaker parameters such as, but not limited to contact motion and interrupting media.

Figure 3:
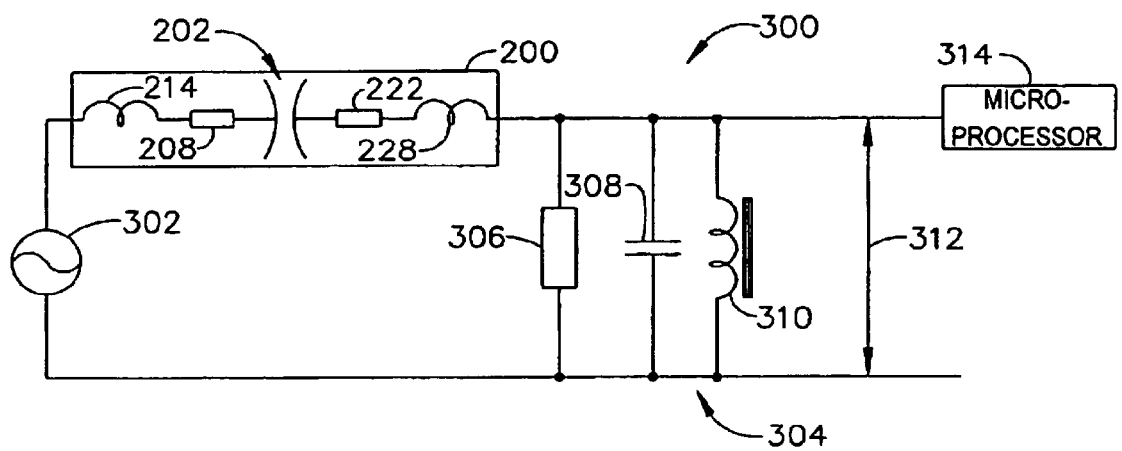
FIG. 3 is a schematic illustration of an exemplary testing circuit that may be used to test a circuit breaker that is represented by the equivalent circuit shown in FIG. 2.

FIG. 3 is a schematic illustration of an exemplary testing circuit 300 that may be used to test a circuit breaker that is represented by equivalent circuit 200 (shown in FIG. 2). Circuit 300 includes a test source that is used to generate a high frequency sine wave signal (Vg(t)) through the circuit breaker contact being measured as represented by circuit 200. In the exemplary embodiment, a frequency is considered to be a high frequency if the frequency is greater than about ten kilohertz. In an alternative embodiment, a frequency is considered to be a high frequency if the frequency is greater than about one kilohertz. A filter 304 is coupled in electrical series to the output of circuit 200. Filter 304 includes a resistor 306, a capacitor 308, and an inductor 310 electrically coupled in parallel to filter noise. In the exemplary embodiment, values of resistance, capacitance and inductance for each respective component in filter 304 is pre-selected to make filter 304 resonant at a frequency that is equal to the frequency of source 302. In an alternative embodiment, the frequency of source 302 is adjusted to a resonant frequency of filter 304. An output voltage ($V_{out}$(t)) 312 of circuit 300 is taken across filter 304. In the exemplary embodiment, output voltage 312 is electrically coupled to a microprocessor 314, which is programmed to receive output voltage 312, analyze data contained within output voltage 312, control voltage source 302, receive commands from an operator, execute scripts that include automatic testing procedures, and generate testing data output. Microprocessor 314 is programmed to analyze output voltage 312 to derive other circuit breaker characteristics indirectly, such as, but not limited to pressure in a contact chamber of the circuit breaker, changes in dielectric constant of gas within the chamber, circuit breaker actuating spring elasticity constant, acceleration of circuit breaker components during operation, vibration of circuit breaker component parts, and an operating time of the circuit breaker.

During testing, with the breaker contacts in an open state, source 302 injects a high frequency sine wave signal into the circuit breaker. Output 312 receives a signal that corresponds to circuit 200 with a minimum capacitance value for capacitor 202. The minimum capacitance value occurs when circuit breaker contacts represented by capacitor 202 are open. The circuit breaker is commanded to close and the movable contact begins moving toward the non-movable contact. As the movable contact travels closer to the non-movable contact, the capacitance of capacitor 202 increases proportionally to the distance traveled. The maximum capacitance value occurs just prior to the time when the movable contact electrically touches the non-movable contact. The maximum capacitance value of circuit 200 corresponds to a maximum value of output voltage 312. The maximum value of output voltage 312 may be obtained by differentiating the output voltage function $V_{out}$(t) with respect to time and setting the equation to be equal to zero. Mathematically the equation is:

$$Vo(t) = Vg(t) - \left\{ (L_a + L_b)\frac{di_g(t)}{dt} + (R_a + R_b)i_g + \frac{1}{C}\int_0^{t_0} i_g \, dt \right\}$$

Than, by equating result to zero, capacitance C is given by:

$$C = \frac{i_g}{Vg - L\frac{d^2 i_g}{dt^2} - R\frac{di_g}{dt}}$$

Where $L = L_a + L_b$ and $R = R_a + R_b$

The output voltage 312 is electrically coupled to a circuit breaker test device (not shown) that includes a microprocessor for controlling test scripts, computing results from input data, analyzing data received, and generating output displays and printed reports. The term microprocessor, as used herein, refers to microprocessors, microcontrollers, reduced instruction set circuits (RISC), application specific integrated circuits (ASIC), logic circuits, and any other circuit or processor capable of executing the functions described herein. In the exemplary embodiment, testing circuit 300 is a subcircuit of the testing device positioned within testing device 300. In an alternative embodiment, testing circuit 300 is a separate component electrically coupleable to testing device 300, and also configurable to electrically couple to an alternate testing device (not shown).

By using a high frequency test voltage with resonant filtering of the output voltage the circuit breaker contact position may be measured dynamically by measuring the capacitance between the fixed and the moving contacts of the circuit breaker. By measuring the maximum capacitance value, the minimum distance between electrodes may be determined.

Figure 4:
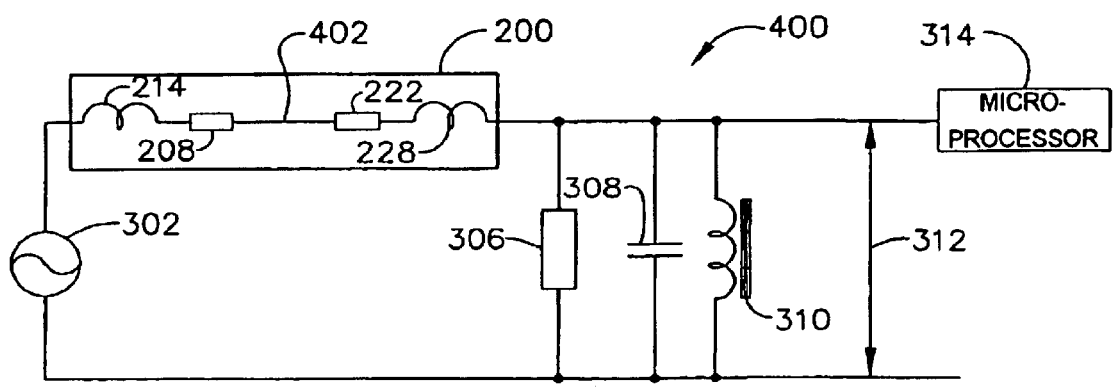
FIG. 4 is a schematic illustration of an equivalent circuit of the testing circuit shown in FIG. 3, illustrated at the time of first contact touch.

FIG. 4 is a schematic illustration of an equivalent circuit 400 of testing circuit 300 (shown in FIG. 3) illustrated at the time of first contact touch. At the time when the movable contact first comes into electrical contact with the non-movable contact, capacitor 202 may be represented as a short circuit 402 and output 312 $V_{out}(t)$ is no longer a monotone function, but becomes a step function with $V_{out}$ as the step value. The time occurrence of the voltage step corresponds to the time the circuit breaker contacts close. This time value may be recorded for use in calculations and may be used to start and stop circuit breaker operational timers. Similarly, during an opening testing sequence, when the circuit breaker contacts first open $V_{out}$ will be a negative step function The capacitance based contact timing circuit may facilitate measuring parameters of high voltage circuit breakers contact systems, such as, but not limited to a start event of the contact geometrical position from the circuit breaker electrically isolated open position, the movement of linear travel of the movable contact, the first electrical touch of each contact, and the penetration as a function of dynamic resistance from the first contact touch to a geometrical end position.

The circuit also facilitates evaluating data from a synchronized time base to comply with standards and calculating circuit breaker parameters and enabling analysis of circuit breaker operation, such as, but not limited to, measuring actual linear movement of each movable contact, measuring a time elapsed from a synchronized start to first touch or last separation of each movable contact, measure a time elapsed from a start event, such as, the contact geometrical position from the circuit breaker electrically isolated open position, to a contact first touch, or a last separation of each contact to an isolated open position, determine a contact velocity in a function of time and movement within above positions, determine overlap, wherein a movement and time elapsed from each contact separation to arcing contact separation at open an operation is measured, and determine a quality of each contact interrupting medium.

Figure 5:
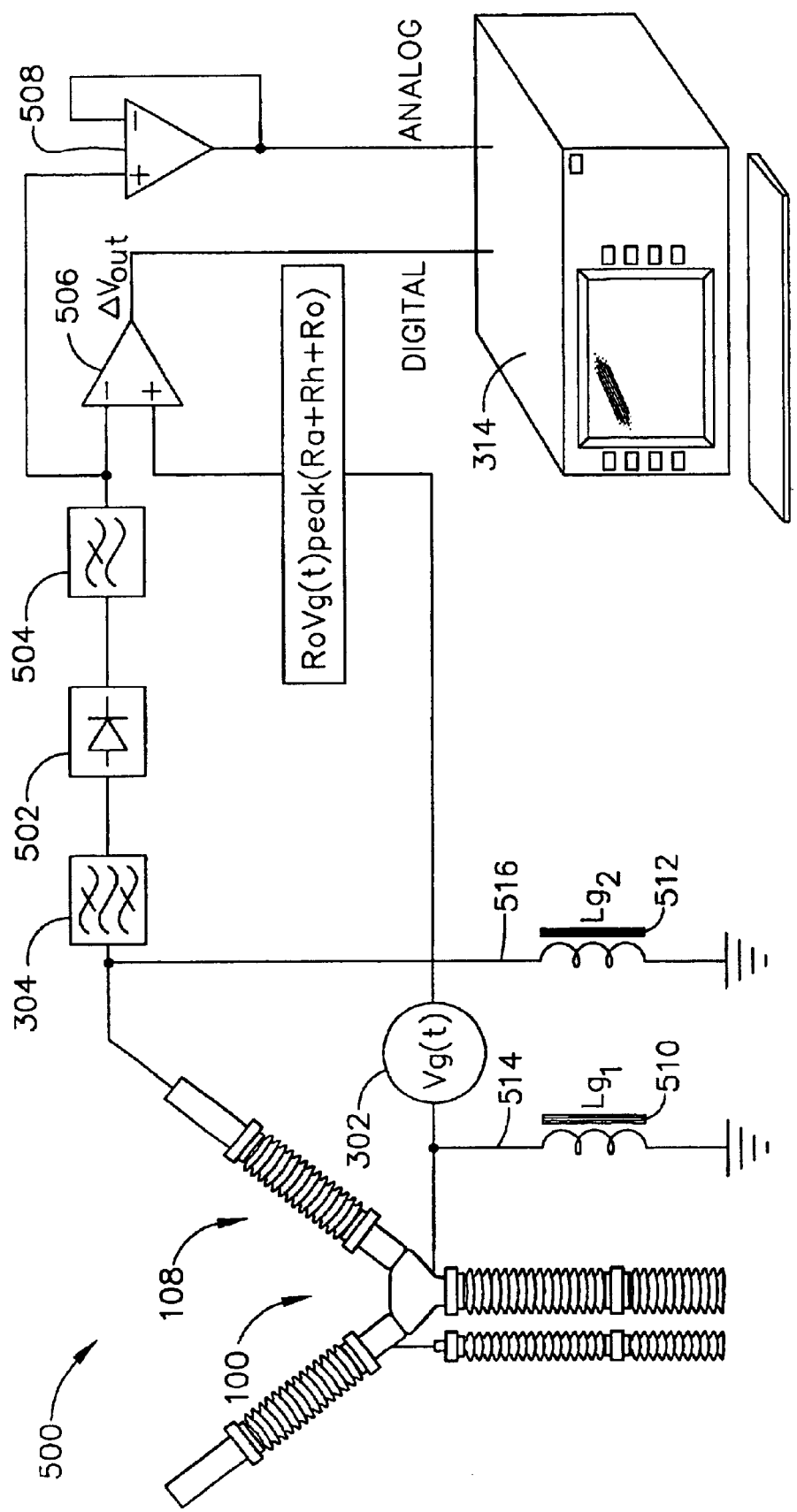
FIG. 5 is a schematic illustration of an exemplary testing circuit that may be used to time the contacts of the circuit breaker phase shown in FIG. 1.

FIG. 5 is a schematic illustration of an exemplary testing circuit 500 that may be used to time the contacts of circuit breaker phase 100 (shown in FIG. 1). During testing, source 302 injects a test signal into circuit breaker contact 106 within break 108. If contact 106 is in an open state, the test signal is transmitting capacitively through contact 106 to the input of resonant filter 304. The filtered output of filter 304 is transmitted to rectifier 502 and low-pass filter 504. The combination of rectifier 502 and low-pass filter 504 envelopes the output of filter 304 to facilitate reducing high frequency noise and facilitate reducing unwanted non-peak related signal information. In the exemplary embodiment, a corner frequency 1/5 of the resonant frequency of capacitor 308 and inductor 310 is used. The signal value from filter 504 is then compared with the voltage value that is greater than RoVg(t)peak/(Ra+Rb+Ro) by comparator 506. The output signal from comparator 506 is equal to $V_{out}$ and is transmitted to a digital input of microprocessor 314 as the "make" or "break" timing result. The output of filter 504 is also transmitted to an input of amplifier 508 to provide an analog output signal to microprocessor 314 for further processing. Inductors 510 and 512 are electrically coupled in series with grounding cables 514 and 516, respectively to drain any currents induced into the circuit breaker circuit. Grounding cables 514 and 516 are applied to the circuit breaker to ensure the personnel safety of operating personnel during testing of the circuit breaker. By introducing an inductance:

$$Lg \gg \frac{1}{\omega^2 C_{\min}}$$

into the circuit breaker grounding cables 514 and 516, the circuit breaker timing measurement may be conducted without disconnecting grounding cables 514 and 516 from the circuit breaker thereby providing greater safety protection to operating personnel.

Figure 6:
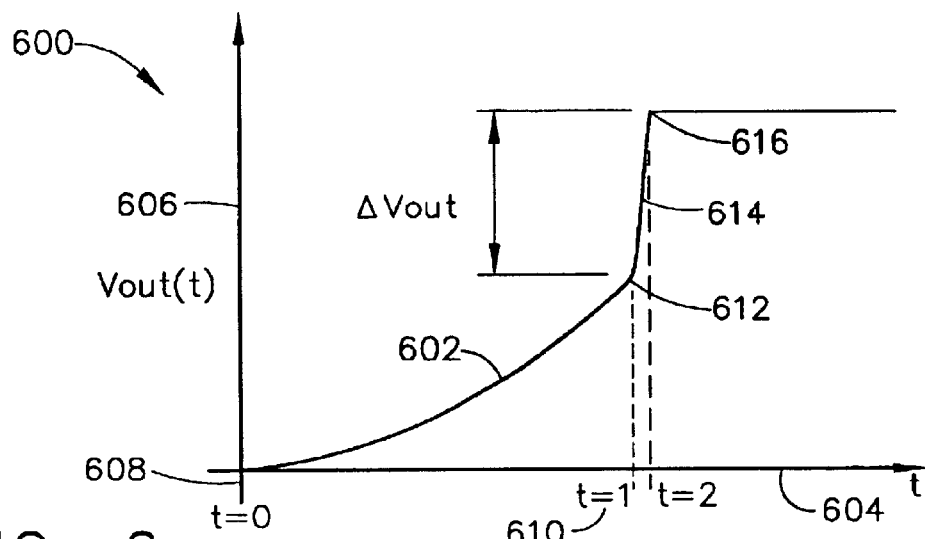
FIG. 6 is a graph of an exemplary trace of the output voltage of the testing circuit during a test procedure.
Figure 7:
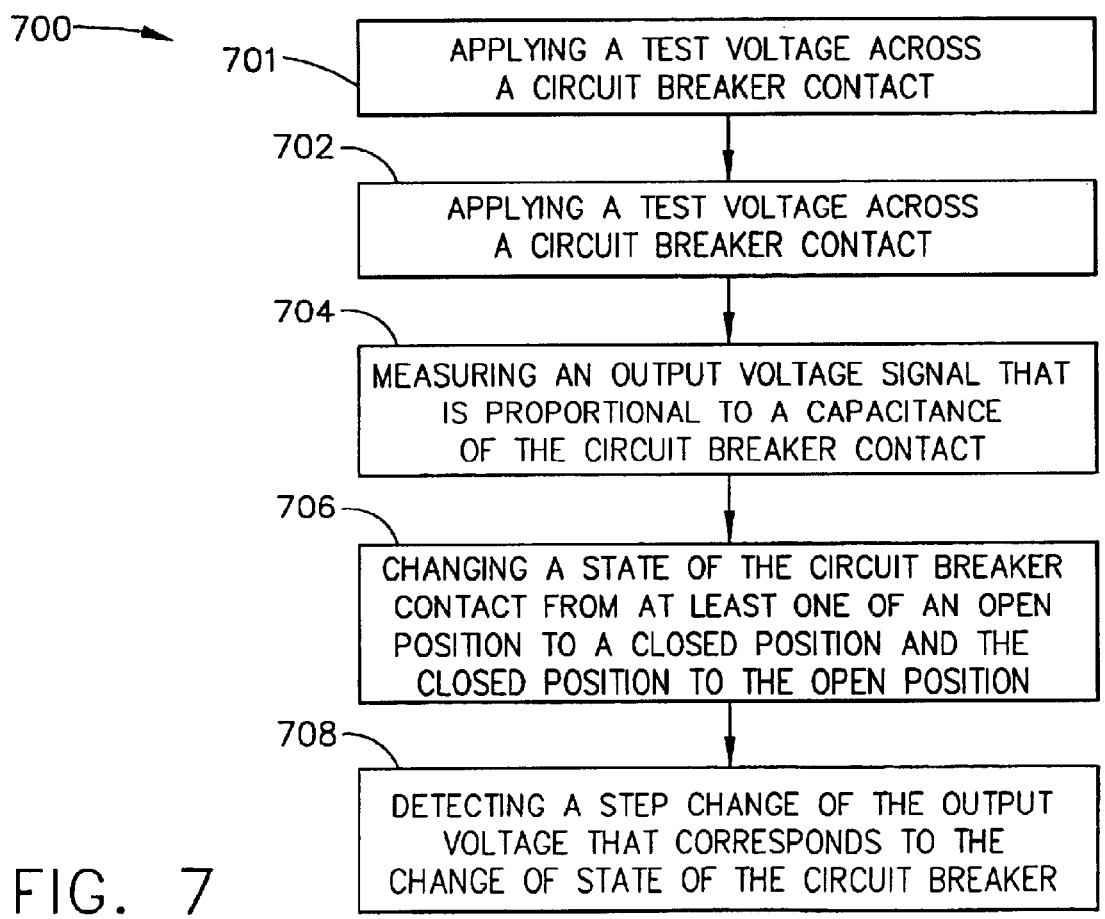
FIG. 7 is a flow diagram of an exemplary method 700 of measuring timing of a circuit breaker while grounding each circuit breaker contact.

FIG. 6 is a graph 600 of an exemplary trace 602 of output voltage 312 of testing circuit 300. Graph 600 includes an x-axis 604 indicative of time, and a y-axis 606 that illustrates a magnitude of output voltage 312 at each corresponding unit of time. At t(0) 608, a circuit breaker operating signal is triggered. Between time, t(0) 608 and a time t(1) 610 the circuit breaker movable contact is moving towards the circuit breaker non-movable contact. As the contacts move closer together, the capacitance and hence, the voltage across the contacts increases. The impedance of the contacts may be determined from the equation: $Z=Ra+Rb+\omega(L_a+L_b)+1/\omega C$. At time t(1) 610, a first contact is detected by the step jump in $V_{out}$ at point 612. At point 612 a "make" signal is generated based on the detected step jump. During jump 614, a dynamic resistance (Z) between the circuit breaker contacts in motion, termed the penetration process, may be determined based on the equation. $Z=R_a+R_b+\omega(L_a+L_b)$. At a point 616, the dominant impedance on the system becomes the inductance of the circuit breaker cables and may be determined by the equation $Z=\omega(L_a+L_b)$ FIG. 7 is a flow diagram of an exemplary method 700 for analyzing a circuit breaker. Method 700 includes electrically coupling 701 each circuit breaker contact to ground. A first grounding cable may be coupled to a line side contact of the circuit breaker to a local ground connection. In one embodiment, a inductance of about one microhenry is coupled in series with the grounding cable. In an alternative embodiment, an inductance of less than about one millihenry is coupled in series with the grounding cable. Similarly, a second grounding cable may be electrically coupled to a load side of contact of the circuit breaker to a local ground connection. Inductance may be coupled in series with the grounding cable as described above. A test voltage is applied across the circuit breaker contact pair. In the exemplary embodiment, the test voltage is a high frequency sine wave signal. The frequency of the test signal is selected to match the resonant frequency of the circuit breaker contact and filter circuit, which are electrically coupled in series with the source. Alternatively, impedance values of the components of the filter circuit may be selected such that the resonant frequency of the filter matches the output frequency of the test source. During testing, the output voltage taken across the filter circuit is proportional to a capacitance value of the circuit breaker contact. Accordingly, measuring 704 an output voltage of the testing circuit provides indication of the capacitance of the circuit breaker contact. The gap defined between each contact determines the capacitance of the circuit breaker contact. The state of the circuit breaker contact is changed 706 from an open position to a closed position or the closed position to the open position by automatic action taken by a microprocessor executing within the test device or by a manual command initiated by an operator. As the movable contact of the circuit breaker contact pair moves relative to the non-movable contact, the capacitance between the contacts changes proportionally with respect to the distance separating the contacts. As the contacts engage the testing circuit configuration changes such that the output voltage changes by a step amount. The step change is detected 708 in the output voltage that corresponds to the change of state of the circuit breaker. An output signal at the time of the step change is generated for use in analyzing a condition of the circuit breaker contacts and dielectric medium.

While the present invention is described with reference to measuring timing and resistance of contacts of a high voltage circuit breaker, numerous other applications are contemplated. For example, it is contemplated that the present invention may be applied to any system wherein electromagnetic interference may induce currents into measured parameters and measuring devices such that the accuracy of such measurements is reduced without suppression of the induced currents.

The above-described high voltage circuit breaker testing system is cost-effective and highly reliable for determining a circuit breaker contact timing and resistance in the presence of induced currents from electromagnetic interference. More specifically, the methods and systems described herein facilitate determining circuit breaker operating times and contact resistances accurately in the presence of electromagnetic induced currents in the circuit breaker circuit and testing circuit. In addition, the above-described methods and systems facilitate providing an accurate and repeatable circuit breaker timing and contact resistance measurement with minimal operator interaction. As a result, the methods and systems described herein facilitate maintaining high voltage circuit breakers in a cost-effective and reliable manner.

Exemplary embodiments of circuit breaker testing systems are described above in detail. The systems are not limited to the specific embodiments described herein, but rather, components of each system may be utilized independently and separately from other components described herein. Each system component can also be used in combination with other system components.

While the invention has been described in terms of various specific embodiments, those skilled in the art will recognize that the invention can be practiced with modification within the spirit and scope of the claims.

What is claimed is:

1. A method for analyzing a circuit breaker that includes at least one contact pair that includes at least one movable contact, said method comprising:

electrically coupling each circuit breaker contact to ground;

applying a test voltage across a circuit breaker contact pair;

measuring an output voltage signal that is proportional to a capacitance of the circuit breaker contact pair across a filter circuit that is resonant at the test voltage frequency;

changing a state of the circuit breaker contact pair from at least one of an open position to a closed position and the closed position to the open position; and detecting a step change of the output voltage that corresponds to the change of state of the circuit breaker.

2. A method in accordance with claim 1 wherein applying a test voltage across a circuit breaker contact pair comprises applying a test voltage from a circuit breaker testing device electrically coupled across the circuit breaker contact.

3. A method in accordance with claim 2 wherein applying a voltage across a circuit breaker contact pair comprises applying a high frequency sine wave voltage across the circuit breaker contact.

4. A method in accordance with claim 1 wherein measuring the output voltage across a filter circuit comprises measuring the output voltage across a filter circuit electrically coupled in series with the circuit breaker contact.

5. A method in accordance with claim 1 wherein measuring the output voltage across a filter circuit comprises measuring the output voltage across a filter circuit that includes a resistor, a capacitor, and an inductor electrically coupled in parallel.

6. A method in accordance with claim 1 wherein changing a state of the circuit breaker contact pair comprises changing the state of the circuit breaker contact pair automatically during execution of an automatic test script.

7. A method in accordance with claim 6 wherein changing a state of the circuit breaker contact pair comprises changing the state of the circuit breaker contact pair automatically during an automatic test script executing on a microprocessor.

8. A method in accordance with claim 1 wherein changing a state of the circuit breaker contact pair comprises changing the state of the circuit breaker contact pair manually.

9. A method in accordance with claim 1 wherein detecting a step change of the output voltage further comprises:

determining a threshold voltage level for a first contact touch position of the circuit breaker contacts moving from at least one of an open position to a closed position, and a closed position to an open position;

comparing the detected step change of the output voltage to the determined threshold level; and generating an output signal based on the comparison.

10. A circuit breaker test device for analyzing circuit breaker contacts comprising at least a test voltage source, a filter circuit, and an output circuit for measuring the circuit breaker contact pair capacitance, said test voltage source and filter circuit configured to be coupled in electrical series with the circuit breaker contact pair during testing wherein said filter is resonant at the selected test voltage frequency.

11. A circuit breaker test device in accordance with claim 10 further comprising a microprocessor programmed to at least one of receive an output voltage signal from said series circuit, analyze data contained within said output voltage signal, control parameters of said voltage source, receive commands from an operator, execute scripts that include automatic testing procedures, and generate testing data output.

12. A circuit breaker test device in accordance with claim 10 wherein said voltage source is selectable to supply a high frequency signal to said series circuit at a predetermined frequency.

13. A circuit breaker test device in accordance with claim 12 wherein said voltage source is selectable to supply a high frequency signal to said series circuit wherein said frequency is a resonant frequency for said series circuit.

14. A circuit breaker test device in accordance with claim 10 wherein said voltage source is selectable to supply a high frequency sine wave signal to said series circuit.

15. A circuit breaker test device in accordance with claim 10 wherein said filter comprises a resistor, an inductor, and a capacitor each electrically coupled in parallel with respect to each other.

16. A circuit breaker test device in accordance with claim 10 further comprising an output circuit, said output electrically coupled in parallel to said filter circuit.

17. A computer program embodied on a computer readable media for analyzing circuit breakers comprising a software code segment programmed to:

control a test source to apply a test voltage across a circuit breaker contact;

measure an output voltage signal across a filter circuit that is resonant at the test voltage frequency, said output voltage signal being derived from the applied test voltage, said output voltage signal being proportional to a capacitance of the circuit breaker contact;

control operation of the circuit breaker under test to change a state of the circuit breaker contact pair from at least one of an open position to a closed position and the closed position to the open position; and detect a step change of the output voltage that corresponds to the change of state of the circuit breaker.

18. A software code segment in accordance with claim 17 programmed to control a test voltage from a circuit breaker testing device electrically coupled across the circuit breaker contact.

19. A software code segment in accordance with claim 17 programmed to apply a high frequency sine wave voltage across the circuit breaker contact.

20. A software code segment in accordance with claim 17 programmed to measure the output voltage across a filter circuit.

21. A software code segment in accordance with claim 20 programmed to measure the output voltage across a filter circuit electrically coupled in series with the circuit breaker contact.

22. A software code segment in accordance with claim 21 programmed to measure the output voltage across a filter circuit that includes a resistor, a capacitor, and an inductor electrically coupled in parallel.

23. A software code segment in accordance with claim 17 programmed to execute a test script that changes the state of the circuit breaker contact pair automatically during execution.

24. A software code segment in accordance with claim 17 programmed to receive a manual user input that is indicative of a command to change the state of the circuit breaker.

25. A software code segment in accordance with claim 17 programmed to:

detect a step change of the output voltage that corresponds to the circuit breaker changing state;

determine a threshold voltage level for a first contact touch position of the circuit breaker contacts moving at least one of an open position to a closed position, and a closed position to an open position;

compare the detected step change of the output voltage to the determined threshold level; and generate an output signal based on the comparison.

* * * * *